United States Patent
Lee et al.

(10) Patent No.: US 6,635,522 B2
(45) Date of Patent: Oct. 21, 2003

(54) METHOD OF FORMING A MOS TRANSISTOR IN A SEMICONDUCTOR DEVICE AND A MOS TRANSISTOR FABRICATED THEREBY

(75) Inventors: Jae-Kyu Lee, Yongin-Shi (KR); Jae-Goo Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/228,060

(22) Filed: Aug. 27, 2002

(65) Prior Publication Data

US 2002/0195666 A1 Dec. 26, 2002

Related U.S. Application Data

(62) Division of application No. 09/621,334, filed on Jul. 21, 2000, now Pat. No. 6,507,075.

(30) Foreign Application Priority Data

Nov. 30, 1999 (KR) .............................................. 99-53878

(51) Int. Cl.[7] .......................................... H01L 21/8238
(52) U.S. Cl. .............................................................. 438/199
(58) Field of Search ................................ 438/199, 231, 438/232, 197

(56) References Cited

U.S. PATENT DOCUMENTS

| | | | |
|---|---|---|---|
| 4,914,500 A | * 4/1990 | Liu et al. ..................... 357/67 |
| 5,472,897 A | 12/1995 | Hsu et al. | |
| 5,637,518 A | 6/1997 | Prall et al. | |
| 5,843,826 A | * 12/1998 | Hong ........................... 438/300 |
| 5,902,121 A | * 5/1999 | Goto ............................ 438/199 |
| 5,970,352 A | * 10/1999 | Shiozawa et al. ............. 438/300 |
| 6,165,826 A | * 12/2000 | Chau et al. ................... 438/231 |
| 6,312,997 B1 | * 11/2001 | Tran ............................. 438/303 |

* cited by examiner

Primary Examiner—David Nelms
Assistant Examiner—Thao Le
(74) Attorney, Agent, or Firm—Lee & Sterba, P.C.

(57) ABSTRACT

Methods of forming a MOS transistor and a MOS transistor fabricated thereby are provided. The MOS transistor includes a semiconductor substrate of a first conductivity type, and an insulated gate pattern having sidewalls disposed on a predetermined region of the semiconductor substrate of a first conductivity type so that portions of the semiconductor substrate of a first conductivity type on at least one side of the insulated gate pattern remain uncovered by the insulated gate pattern. The MOS transistor also includes impurity regions having at least an upper surface of a second conductivity type disposed on the semiconductor substrate at at least one side of the insulated gate pattern, as well as at least one spacer disposed on at least one sidewall of the insulated gate pattern. The MOS transistor further contains a pad of a second conductivity type disposed on an upper surface of the impurity regions, whereby the pad covers a lower portion of the at least one spacer.

15 Claims, 6 Drawing Sheets

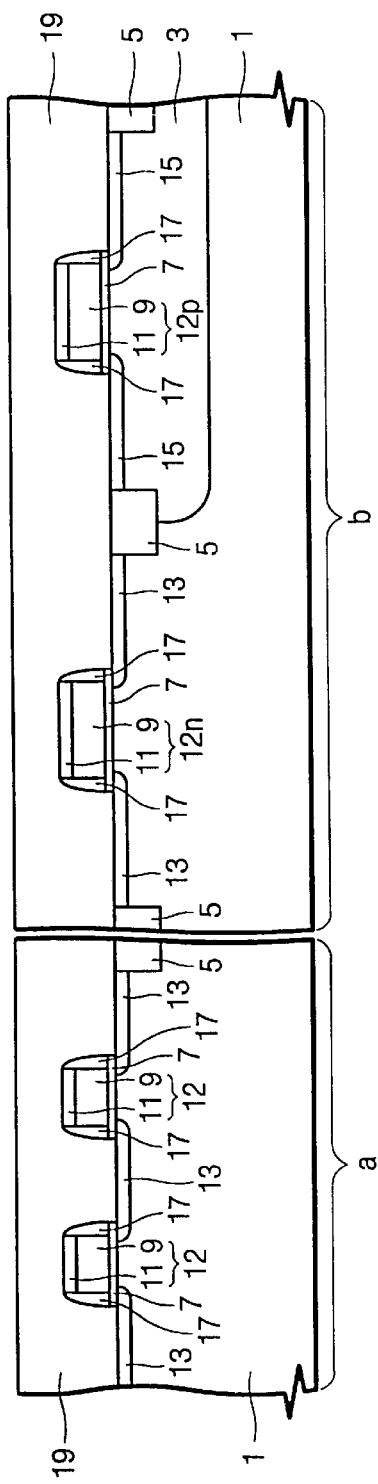
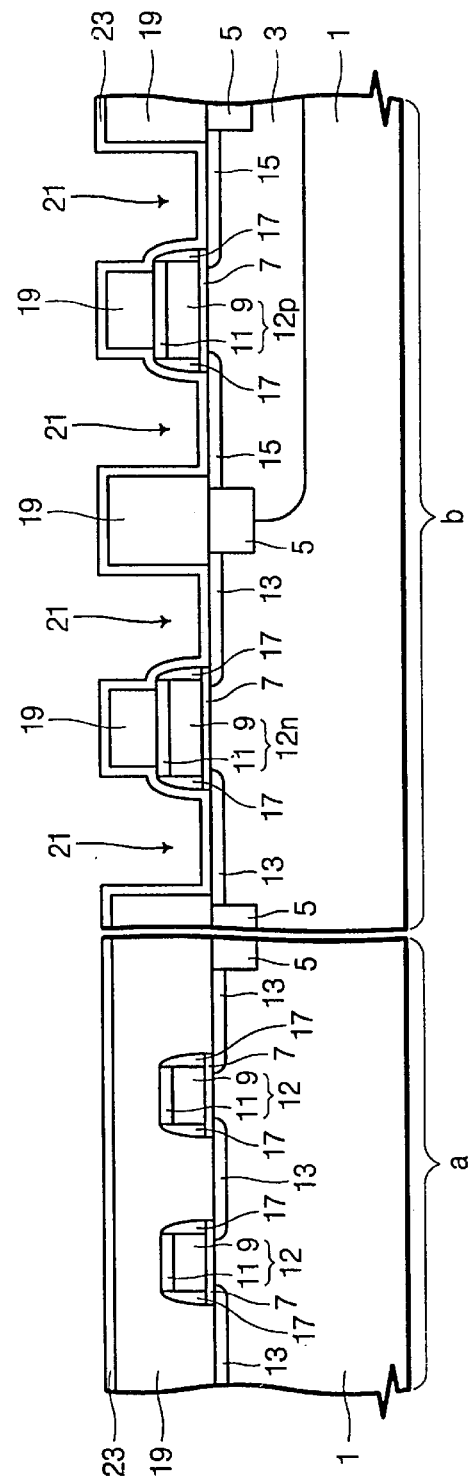

METHOD OF FORMING A MOS TRANSISTOR IN A SEMICONDUCTOR DEVICE AND A MOS TRANSISTOR FABRICATED THEREBY

This application is a division of application Ser. No. 09/621,334, filed Jul. 21, 2000 now U.S. Pat. No. 6,507,075.

FIELD OF THE INVENTION

The invention relates to a metal oxide semiconductor (MOS) transistor, a semiconductor device containing the MOS transistor, and to methods of making the MOS transistor.

BACKGROUND OF THE INVENTION

Attempts to increase device integration density in microelectronic integrated circuits typically have resulted in the fabrication of smaller and smaller MOS transistors having shorter channels. Decreasing the channel length of the MOS transistors, however, degrades the punch-through characteristics and the drain induced barrier lowering (DIBL) characteristics. Due to this degradation, drain leakage current can flow through the channel even if a sub-threshold voltage is applied to the gate of the MOS transistor. This in turn increases a stand-by current of the semiconductor device that includes short channel MOS transistors. Many mechanisms have therefore been proposed in order to solve this short channel effect.

For example, proposed methods of improving the short channel effect include reducing the thickness of the gate insulating layer, and increasing the doping concentration of the channel. These methods, however, result in the variation of the threshold voltage of the MOS transistor. Accordingly, techniques recently have been developed for forming shallow source/drain regions in order to improve the short channel effect. Forming the source/drain regions too shallow, however, reduces the process margin of over etching for forming contact holes and exposing the source/drain regions. In other words, if the junction depth of the source/drain region is too shallow, it is difficult to control the over etching process for etching an interlayer insulating layer on the shallow source/drain regions.

A method of forming a MOS transistor is described in U.S. Pat. No. 5,843,826 entitled "Deep submicron MOSFET device" by Hong, which is incorporated herein by reference in its entirety. According to Hong, elevated polysilicon patterns are formed on isolation layers at both sides of an active region, and a silicon layer is grown using a selective epitaxial growth technology on the active region and the elevated polysilicon patterns. A MOS transistor then is formed on the epitaxial silicon layer using conventional methods. Accordingly, it is possible to realize elevated source/drain regions extending into the upper regions of the isolation layer. As a result, it is possible to minimize the width of the active region and to concurrently increase the over etching process margin during formation of the contact hole and exposing the source/drain region.

Selective epitaxial growth technology, however, requires very accurate process conditions. For example, surfaces of the underlying material layers, e.g., the active region and the polysilicon layer should be very clean. Thus, it is difficult to form a uniform epitaxial layer on the active region and the polysilicon pattern, in the event that contaminants such as crystal defects due to the etch damages, or native oxide layers exist on the active region or the polysilicon pattern. Thus, a pre-cleaning treatment needs to be performed prior to the epitaxial growing process, which requires very careful attention. Also, according to Hong, it is difficult to minimize the width of the isolation layer under the elevated source/drain region. Accordingly, there are limitations in increasing the integration density using the methods described in Hong.

SUMMARY OF THE INVENTION

It is a feature of the present invention to provide simple and less complicated methods for forming MOS transistors, which can increase the over etching process margin of the etching process for forming contact holes and exposing the source/drain regions. It is another feature of the present invention to provide methods of forming MOS transistors that can easily form shallow source/drain regions. It is still another feature of the present invention to provide a MOS transistor having shallow source/drain regions. These and other features of an embodiment of the present invention may be provided by a MOS transistor including a semiconductor substrate of a first conductivity type, and an insulated gate pattern having sidewalls disposed on a predetermined region of the semiconductor substrate of a first conductivity type. The insulated gate pattern is disposed so that portions of the semiconductor substrate of a first conductivity type on at least one side of the insulated gate pattern remain uncovered by the insulated gate pattern. The MOS transistor also includes impurity regions having at least an upper surface of a second conductivity type disposed on the semiconductor substrate at at least one side of the insulated gate pattern, and at least one spacer is disposed on at least one sidewall of the insulated gate pattern. The MOS transistor further contains a pad of a second conductivity type disposed on an upper surface of the impurity regions, whereby the pad covers a lower portion of the at least one spacer.

In accordance with another feature of an embodiment of the invention, there is provided a method of making a MOS transistor including providing a semiconductor substrate of a first conductivity type, and forming an insulated gate pattern having sidewalls on a predetermined region of the semiconductor substrate of a first conductivity type. The insulated gate pattern is formed so that portions of the semiconductor substrate of a first conductivity type on at least one side of the insulated gate pattern remain uncovered by the insulated gate pattern. Impurity regions of a second conductivity type can be formed on the semiconductor substrate of a first conductivity type at at least one side of the gate pattern, and a first interlayer insulating layer formed on the entire surface of the resultant structure having the impurity regions. The method also includes forming pad contact holes by patterning the first interlayer insulating layer and by exposing at least a portion of the impurity regions, and forming a conformal buffer layer on the entire surface of the resultant structure having the pad contact holes. The method further includes forming at least one pad by patterning the conformal buffer layer, whereby the at least one pad covers at least the impurity regions.

In accordance with other features of an embodiment of the invention, there is provided a method of forming a MOS transistor that includes providing a semiconductor substrate of a first conductivity type, and forming a second conductivity type well at a predetermined region of the semiconductor substrate of a first conductivity type. A first insulated gate pattern having sidewalls and a second insulated gate pattern having sidewalls are formed on a predetermined region of the semiconductor substrate of a first conductivity type, and on a predetermined region of the well, respectively. The first and second insulated gate patterns are formed so that portions of the semiconductor substrate of a first conductivity type on both sides of the first insulated gate pattern remain exposed, and portions of the well on both sides of the second insulated gate pattern remain exposed.

The method also includes forming second conductivity type impurity regions on portions of the semiconductor substrate of a first conductivity type at both sides of the first insulated gate pattern that remain exposed, and forming first conductivity type impurity regions on portions of the well at both sides of the second insulated gate pattern that remain exposed. A first interlayer insulating layer is formed on the entire surface of the resultant structure having the first and second conductivity type impurity regions, and having the first and second insulated gate patterns, and then patterned to form pad contact holes. Forming the pad contact holes exposes the first and second conductivity type impurity regions so that portions of the first interlayer insulating layer remain disposed on the first and second insulated gate patterns.

The method further includes forming a conformal undoped buffer layer on the entire surface of the resultant structure having the pad contact holes and the portions of the first interlayer insulating layer, and ion-implanting second conductivity type impurities in the conformal undoped buffer layer that is disposed on the second conductivity type impurity regions to form a second conductivity type buffer layer. First conductivity type impurities can then be ion-implanted in the conformal undoped buffer layer that is disposed on the first conductivity type impurity regions to form a first conductivity type buffer layer. Sacrificial insulating layer residues can be formed to cover the first and second conductivity type buffer layers on the bottoms of the pad contact holes. The first and second conductivity type buffer layers then can be etched using the sacrificial insulating layer residues as etching masks to form a first conductivity type pad and a second conductivity type pad on the first conductivity type impurity region and on the second conductivity type impurity region, respectively.

These and other features of the invention will be readily apparent to those skilled in the art upon reading the description of preferred embodiments that follows.

BRIEF DESCRIPTION OF THE DRAWINGS

FIGS. 1–5 are cross-sectional views illustrating preferred methods for forming a MOS transistor according to various embodiments of the present invention;

DESCRIPTION OF PREFERRED EMBODIMENTS

Figure 3:
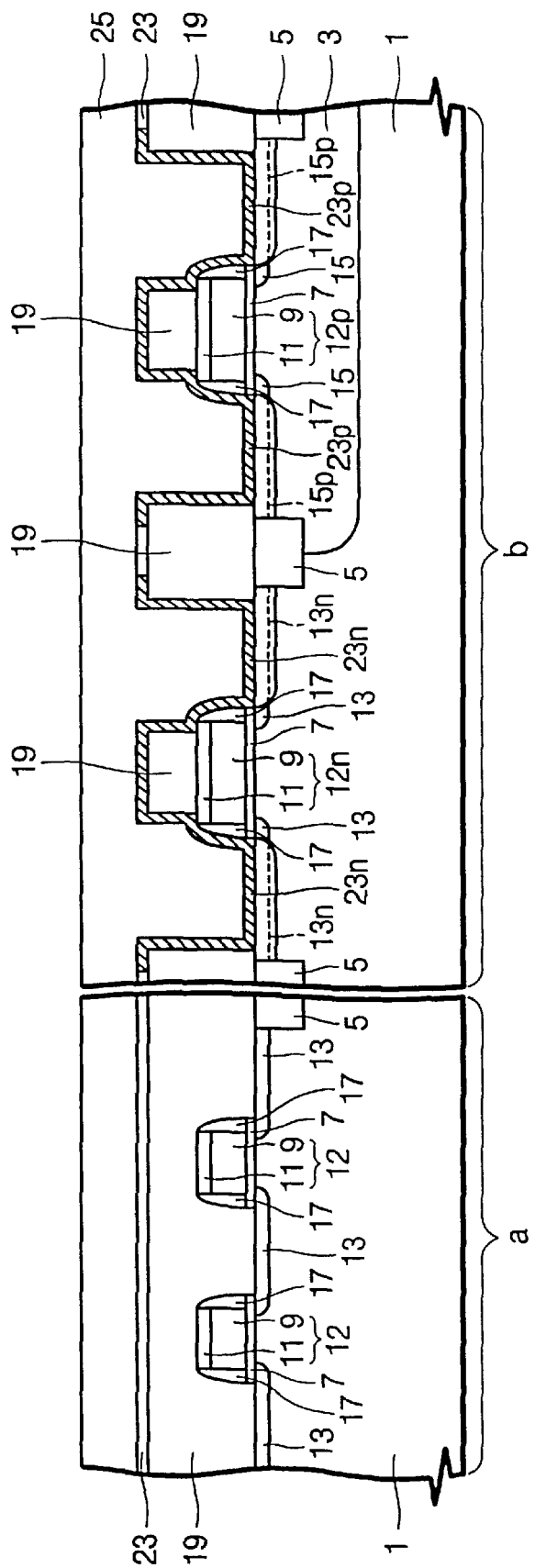

Korean Patent Application No. 99-53878, filed on Nov. 30, 1999, and entitled "Methods of Forming MOS Transistor in Semiconductor Device and MOS Transistor Fabricated Thereby," is incorporated herein by reference in its entirety.

The present invention will now be described more fully with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of various embodiments of the invention to those skilled in the art.

In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout this description and the drawings. Also, in the drawings, the reference character "a" represents a cell array region and the reference character "b" represents a peripheral circuit region.

One embodiment of the invention relates to a MOS transistor including a semiconductor substrate of a first conductivity type, and an insulated gate pattern having sidewalls disposed on a predetermined region of the semiconductor substrate of a first conductivity type. The insulated gate pattern is disposed so that portions of the semiconductor substrate of a first conductivity type on at least one side of the insulated gate pattern remain uncovered by the insulated gate pattern. The MOS transistor also includes impurity regions having at least an upper surface of a second conductivity type disposed on the semiconductor substrate at at least one side of the insulated gate pattern, and at least one spacer is disposed on at least one sidewall of the gate pattern. The MOS transistor further contains a pad of a second conductivity type disposed on an upper surface of the impurity regions, whereby the pad covers a lower portion of the at least one spacer.

The MOS transistor preferably further includes a second interlayer insulating layer covering the insulated gate pattern, the spacer and the pad, and a metal interconnection penetrating a predetermined region of the second interlayer insulating layer whereby the metal interconnection is electrically connected to the pad.

Another embodiment of the invention relates to a method of making a MOS transistor including providing a semiconductor substrate of a first conductivity type, and forming an insulated gate pattern having sidewalls on a predetermined region of the semiconductor substrate of a first conductivity type. The insulated gate pattern is formed so that portions of the semiconductor substrate of a first conductivity type on at least one side of the insulated gate pattern remain uncovered by the insulated gate pattern. Impurity regions of a second conductivity type can be formed on the semiconductor substrate of a first conductivity type at at least one side of the insulated gate pattern, and a first interlayer insulating layer formed on the entire surface of the resultant structure having the impurity regions. The method also includes forming pad contact holes by patterning the first interlayer insulating layer and by exposing at least a portion of the impurity regions, and forming a conformal buffer layer on the entire surface of the resultant structure having the pad contact holes. The method further includes forming at least one pad by patterning the conformal buffer layer, whereby the at least one pad covers at least the impurity regions.

A portion of the conformal buffer layer, which preferably is in contact with the impurity region, can be doped with impurities having the same conductivity type as the impurity region. It is preferred that the first conductivity type and the second conductivity type are P-type and N-type, respectively. Alternatively, the first conductivity type and the second conductivity type may be N-type and P-type, respectively. Also, it is preferable that the semiconductor substrate is a silicon substrate and the conformal buffer layer is a polysilicon layer.

The impurity region preferably is formed by ion-implanting second conductivity type impurities into the active region defined at predetermined regions of the semiconductor substrate. More specifically, forming the impurity region includes forming an insulated gate pattern on a predetermined region of the active region and ion-implanting second conductivity type impurities into the active region using the insulated gate pattern as an ion-implantation mask. Here, the ion-implantation process for forming the impurity region is preferably performed at a low dose of $1\times10^{12}$ to $1\times10^{14}$ ion atoms/cm$^2$.

Forming the insulated gate pattern preferably entails forming a gate insulating layer on a predetermined region of the substrate, preferably on the active region of the substrate. A conductive layer and a capping layer then preferably are sequentially formed on at least one predetermined region of the gate insulating layer. The capping layer and the gate insulating layer preferably then are patterned in sequence to form a gate electrode and a capping layer that are sequentially stacked on a predetermined region of the gate insulating layer. Here, the process for forming the capping layer may be omitted. The insulated gate pattern preferably corresponds to the gate electrode that is comprised of the conductive layer pattern. The conductive layer is preferably formed of a doped polysilicon layer or a polycide layer, and the capping layer is preferably formed of an insulating layer having etching selectivity with respect to the first interlayer insulating layer, for example, a silicon nitride layer.

Preferably, a spacer is formed on a sidewall of the insulated gate pattern prior to the formation of the first interlayer insulating layer. The spacer is preferably formed of the same material layer as the capping layer, e.g., silicon nitride.

The pad contact holes (or hole) preferably are formed with a self-aligned contact technology. Self-aligned contact technology is known to those skilled in the art, and skilled artisans are capable of forming the pad contact holes, using the guidelines provided herein. The pad contact holes preferably expose the spacer adjacent to the impurity region, as well as the impurity region.

The conformal buffer layer preferably is formed by ion-implanting second conductivity type impurities into an undoped semiconductor layer after formation of the undoped semiconductor layer. The undoped semiconductor layer preferably is formed on the entire surface of the resultant structure having the pad contact holes, and it preferably follows the step difference of the pad contact holes. At this time, the second conductivity type impurities preferably are implanted into at least a portion of the undoped semiconductor layer which is in contact with the impurity region of a second conductivity type. Thus, the conformal buffer layer includes the potion of the semiconductor layer doped with second conductivity type impurities. The ion implantation process for forming the doped semiconductor layer preferably is performed at a high dose of $1\times10^{15}$ to $1\times10^{16}$ ion atoms/cm$^2$.

The undoped semiconductor layer preferably is formed of an undoped silicon layer, preferably an undoped polysilicon layer. The second conductivity type impurities implanted into the conformal buffer layer can be diffused into the impurity region due to a subsequent thermal processes thereby forming a high concentration source/drain region in the substrate at both sides of the insulated gate pattern. Thus, there is no requirement to implant impurities directly into the substrate at a high dose in order to form source/drain regions having a high concentration. As a result, it is possible to form a shallow source/drain region, when compared to the deeper source/drain regions encountered in the conventional art. Also, the processes of an embodiment of the invention can prevent the substrate from being damaged by ion implantation process that utilize high dosages. Therefore, it is possible to improve the junction leakage characteristics of the source/drain region.

Forming the at least one pad preferably includes forming a sacrificial insulating layer that fills the pad contact holes on the entire surface of the resultant structure having the conformal buffer layer. The sacrificial insulating layer preferably is partially etched until the conformal buffer layer on the top surface of the first interlayer insulating layer and on at least a portion of sidewalls of the pad contact holes is exposed, thereby forming sacrificial insulating layer residues covering the conformal buffer layer on the bottom of the respective pad contact holes. The exposed buffer layer then is preferably etched using the sacrificial insulating layer residues as an etching mask to leave a portion of the conformal buffer layer under the sacrificial insulating layer residues. The sacrificial insulating layer preferably is formed of the same material layer as the first interlayer insulating layer, e.g., silicon oxide. The sacrificial insulating layer preferably is etched using a dry-etching process or a wet-etching process.

In addition, an embodiment of the present invention may further include forming a second interlayer insulating layer on the entire surface of the resultant structure having the at least one pad. The second interlayer insulating layer then preferably is patterned to form a metal contact hole exposing the at least one pad. Then, it is preferred to form a metal interconnection covering the metal contact hole. Here, in the event the second interlayer insulating layer is over-etched so as to completely expose the pad, the source/drain region is protected from being etched because the pad exists on the source/drain region.

Another embodiment of the invention relates to a method of forming a MOS transistor that includes providing a semiconductor substrate of a first conductivity type, and forming a second conductivity type well at a predetermined region of the semiconductor substrate of a first conductivity type. A first insulated gate pattern having sidewalls and a second insulated gate pattern having sidewalls are formed on a predetermined region of the semiconductor substrate of a first conductivity type, and on a predetermined region of the well, respectively. The first and second insulated gate patterns are formed so that portions of the semiconductor substrate of a first conductivity type on both sides of the first insulated gate pattern remain exposed, and portions of the well on both sides of the second insulated gate pattern remain exposed.

The method also includes forming second conductivity type impurity regions on portions of the semiconductor substrate of a first conductivity type at both sides of the first insulated gate pattern that remain exposed, and forming first conductivity type impurity regions on portions of the well at both sides of the second insulated gate pattern that remain exposed. A first interlayer insulating layer is formed on the entire surface of the resultant structure having the first and second conductivity type impurity regions, and having the first and second insulated gate patterns, and then patterned to form pad contact holes. Forming the pad contact holes exposes the first and second conductivity type impurity regions so that portions of the first interlayer insulating layer remain disposed on the first and second insulated gate patterns.

The method further includes forming a conformal undoped buffer layer on the entire surface of the resultant structure having the pad contact holes and the portions of the first interlayer insulating layer, and ion-implanting second conductivity type impurities in the conformal undoped buffer layer that is disposed on the second conductivity type impurity regions to form a second conductivity type buffer layer. First conductivity type impurities can then be ion-implanted in the conformal undoped buffer layer that is disposed on the first conductivity type impurity regions to form a first conductivity type buffer layer. Sacrificial insulating layer residues can be formed to cover the first and second conductivity type buffer layers on the bottoms of the pad contact holes. The first and second conductivity type buffer layers then can be etched using the sacrificial insulating layer residues as etching masks to form a first conductivity type pad and a second conductivity type pad on the first conductivity type impurity region and on the second conductivity type impurity region, respectively.

In this embodiment, it is preferred to form spacers on the sidewalls of the first and second insulated gate patterns prior to forming the first interlayer insulating layer. It also is preferred to form the sacrificial insulating layer residues by forming a sacrificial insulating layer filling the pad contact holes on the entire surface of the resultant structure having the first and second conductivity type buffer layers. Then, the sacrificial insulating layer preferably is etched to thereby expose the buffer layers on the upper surface of the first interlayer insulating layer and on sidewalls of the pad contact holes.

Referring now to FIG. 1, a second conductivity type well 3 preferably is formed at a predetermined region of a first conductivity type of a semiconductor substrate 1. Here, the first conductivity type and the second conductivity type preferably are P-type and N-type, respectively. As will be appreciated by those skilled in the art, P-type regions are those regions implanted with P-type impurity ions, whereas N-type regions are those regions implanted with N-type impurity ions. Skilled artisans are capable of utilizing suitable P-type and N-type impurity ions in various embodiments of the invention. The second conductivity type well 3, e.g., N-well, preferably is formed in order to provide a bulk region of a PMOS transistor constituting a peripheral circuit region b. Those skilled in the art are capable of forming second conductivity type well 3 in the peripheral region b of substrate 1, using the guidelines provided herein.

An isolation layer 5 preferably is formed at predetermined regions of substrate 1 that has the second conductivity type well 3. Isolation layer 5 defines active regions in substrate 1. The isolation layer 5 may be formed using conventional technology, such as a local oxidation of silicon (LOCOS) process, or a trench isolation process. Those skilled in the art are capable of forming isolation layer 5 using any techniques known in the art, using the guidelines provided herein.

A gate insulating layer 7, e.g., a thermal oxide layer, can be formed on the active regions. A conductive layer and a capping layer then can be sequentially formed on the resultant structure that has the gate insulating layer 7. The capping layer and the conductive layer preferably are patterned in sequence to form at least a first to a third insulated gate pattern, shown as regions 12n, 12p and 12, on predetermined regions of the gate insulating layer 7. The respective insulated gate patterns can include a gate electrode 9 (e.g., conductive layer referred to above), and a capping layer 11, which preferably are sequentially stacked.

In FIG. 1, the first insulated gate pattern 12n is formed on the substrate 1 of the peripheral circuit region b, the second insulated gate pattern 12p is formed on the well 3 of the peripheral circuit region b, and the third insulated gate pattern 12 is formed in the cell array region a. Skilled artisans will recognize that additional gate patterns could be formed in the respective cell array and peripheral circuit regions. The conductive layer (e.g., gate electrode 9), preferably is formed of a doped polysilicon layer or a polycide layer. The capping layer (i.e., capping layer 11), preferably is an insulating layer such as a silicon nitride layer that has a superior etching selectivity with respect to a subsequently deposited interlayer insulating layer. The capping layer 11 preferably has a superior etching selectivity with respect to a silicon oxide layer, which is widely used as an interlayer insulating layer.

Second conductivity type impurities then can be implanted into the active regions that are present on both sides of the first and third insulated gate patterns 12n and 12 to thereby form second conductivity type impurity regions 13, e.g., N-type lightly doped drain (LDD) regions. An N-type impurity ion such as phosphorous (P) or arsenic (As) may be used as the second conductivity type impurity for forming the impurity regions 13. First conductivity type impurities then can be implanted into the active regions that are present on both sides of the second insulated gate pattern 12p to thereby form first conductivity type impurity regions 15, e.g., P-type lightly doped drain (LDD) regions. A P-type impurity ion such as boron (B) or boron fluoride ($BF_2$) may be used as the first conductivity type impurity for forming the impurity regions 15. The ion implantation process for forming the impurity regions 15 may be omitted.

Upon forming the impurity regions 13 and 15 by performing the ion implantation processes described above, any etching damages that may exist at portions under the edge of the insulated gate patterns 12n, 12p and 12 may be cured by carrying out a thermal oxidation process. At this time, the impurities in the impurity regions 13 and 15 are diffused and activated.

The impurity regions 13 and 15 preferably are formed by ion-implanting the impurities at a low dose of $1\times10^{12}$ to $1\times10^{14}$ ion atoms/cm$^2$. An insulating layer (not shown) having etching selectivity with respect to a subsequently deposited interlayer insulating layer, (preferably a silicon oxide layer), is formed on the entire surface of the resultant structure where the impurity regions 13 and 15 are present. The insulating layer then can be anisotropically etched to form a spacer 17 on the sidewalls of the insulated gate patterns 12n, 12p and 12. The insulating layer for forming the spacer 17 preferably is formed of the same material as the capping layer 11, e.g., a silicon nitride layer, or may be formed of another material having the appropriate etching selectivity. The substrate having the spacer 17 then can be covered with a first interlayer insulating layer 19, e.g., a chemical vapor deposition (CVD) silicon oxide layer.

Referring to FIG. 2, the first interlayer insulating layer 19 is patterned to form pad contact holes 21, thereby exposing impurity regions 13 and 15 of the peripheral circuit region b. The pad contact holes 21 may be formed using a conventional self-aligned contact hole forming technology. In this case, the pad contact hole 21 exposes the spacer 17 as well as the impurity regions 13 and 15, as shown in FIG. 2. Those skilled in the art are capable of forming pad contact holes 21 using techniques known in the art.

A conformal undoped buffer layer 23 can then be formed on the entire surface of the resultant structure having the pad contact holes 21. The conformal undoped buffer layer 23 preferably follows the step difference of the pad contact holes 21. The conformal undoped buffer layer 23 can be formed of a conformal undoped semiconductor layer, such as an undoped silicon layer. The undoped silicon layer may be an undoped polysilicon layer. Here, the thickness of the conformal undoped buffer layer 23 should be less than the thickness of gate electrode 9, although this is not required.

Referring now to FIG. 3, second conductivity type impurities can be selectively implanted into the undoped buffer layer 23 on the second conductivity type impurity regions 13 of the peripheral circuit region b, thereby forming a second conductivity type buffer layer 23n. The buffer layer 23n preferably is doped with impurities such as arsenic (As) ions. In a similar fashion, first conductivity type impurities can be selectively implanted into the undoped buffer layer 23 on the first conductivity type impurity regions 15 of the peripheral circuit region b, thereby forming a first conductivity type buffer layer 23p. The buffer layer 23p preferably is doped with impurities such as boron fluoride ($BF_2$) ions.

The buffer layers 23n and 23p preferably are formed by ion-implanting the impurities at a high dose of $1\times10^{15}$ to $1\times10^{16}$ ion atoms/$cm^2$. In addition, the ion implantation processes for forming the buffer layers 23n and 23p preferably are performed at a certain energy so that a projection range ($R_P$) is set in the conformal undoped buffer layer 23. Setting projection range ($R_P$) in conformal undoped buffer layer 23 can prevent impurity regions 13 and 15 from being directly damaged by the ion implantation process when forming the buffer layers 23n and 23p. Performing ion implantation in this manner remarkably suppresses the phenomenon whereby crystal defects are generated near the junction of the impurity regions 13 and 15. This consequently improves any junction leakage current characteristics.

In the meantime, in the event that a subsequent thermal process is carried out on the structure, the impurities in the buffer layers 23p and 23n are diffused into the impurity regions 15 and 13, thereby respectively forming first and second conductivity type source/drain regions 15p and 13n, each having a high impurity concentration. After carrying out such a thermal process, the second conductivity type impurity region 13 remains under the spacer 17 formed on the sidewall of the first insulated gate pattern 12n, and the first conductivity type impurity region 15 remains under the spacer 17 formed on the sidewall of the second insulated pate pattern 12p. Consequently, the first conductivity type impurity regions 15 and the first conductivity type source/drain region 15p constitute an LDD-type source/drain region of a PMOS transistor. Similarly, the second conductivity type impurity regions 13 and the second conductivity type source/drain region 13n constitute an LDD-type source/drain region of a NMOS transistor. In addition, the conformal undoped buffer layer 23, the first conductivity type buffer layer 23n, and the second conductivity type buffer layer 23p, constitute a conformal buffer layer.

A sacrificial insulating layer 25 filling the pad contact holes then can be formed on the entire surface of the resultant structure having the conformal buffer layer, as well as over the surface of the cell array region a. The sacrificial insulating layer 25 preferably is formed of a silicon oxide layer having a superior filling characteristic, e.g., high density plasma (HDP) oxide layer, and the like. Those skilled in the art are capable of forming sacrificial insulating layer 25, using the guidelines provided herein.

Figure 4:
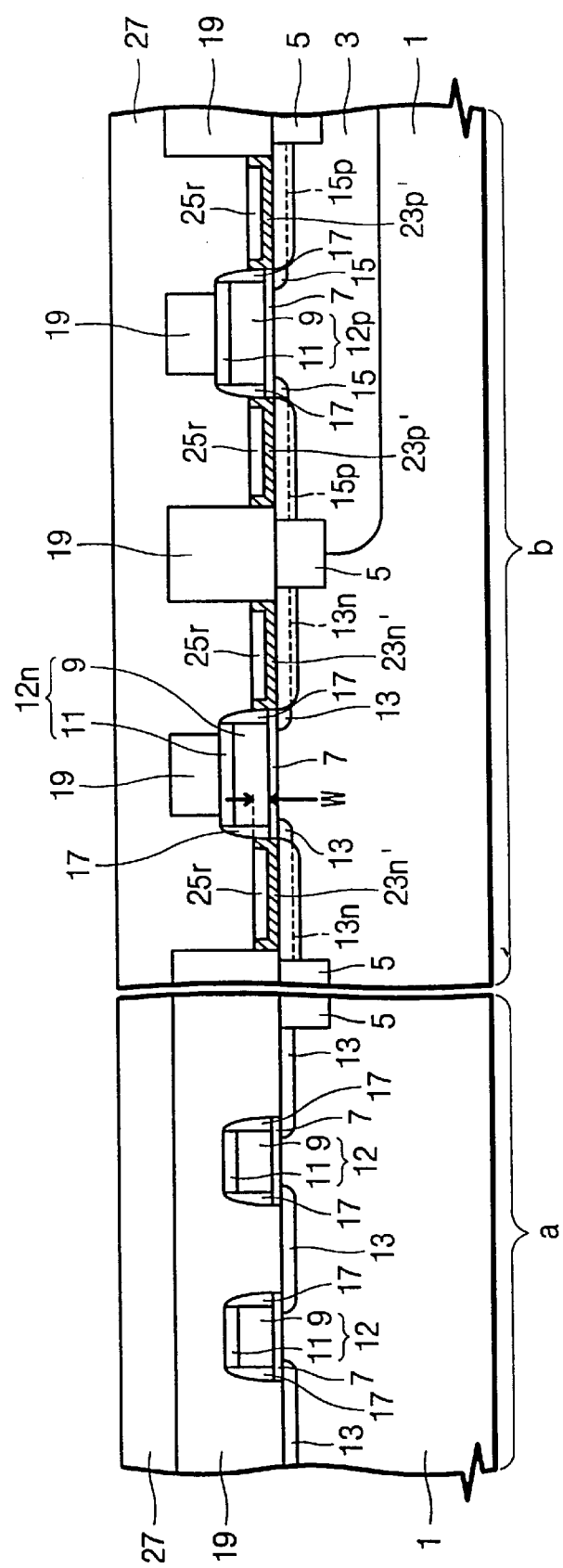

Referring now to FIG. 4, the sacrificial insulating layer 25 can be partially etched to form sacrificial insulating layer residues 25r at or near the bottom of the pad contact holes. The sacrificial insulating layer 25 preferably is etched until the conformal buffer layer (23, 23n, and 23p) that is present on the top surface of the first interlayer insulating layer 19, and on sidewalls of the pad contact holes is exposed. The sacrificial insulating layer 25 may be etched using a dry-etching process, a wet-etching process, or other etching processes known to those skilled in the art.

The exposed conformal buffer layer then can be etched using the sacrificial insulating layer residues 25r as an etching mask, thereby forming first and second conductivity type pads 23p' and 23n', respectively, that exist under the sacrificial insulating layer residues 25r. The exposed conformal buffer layer preferably is etched using an isotropic etching process, e.g., wet-etching process. Preferably, a mixture of HNO3, CH3COOH and HF can be used as the wet etchant for etching the exposed conformal buffer layer. Accordingly, the spacers 17 on the sidewalls of the first and second insulated gate patterns 12n and 12p are exposed. It is preferable to minimize the width W of the overlap region between the gate electrode 9 and the respective pads 23p' or 23n'. While not intending on being bound by any theory, the inventors believe that the parasitic capacitance between the gate electrode 9 and the pads 23p' or 23n' is reduced when the overlap width W decreases.

In addition, though not shown in FIG. 4, a metal silicide layer may be formed on the first and second conductivity type pads 23p' and 23n'. In this alternative embodiment, the sacrificial insulating layer residues 25r can be removed to expose the pads 23p' and 23n', and then a metal silicide layer can be formed on the exposed pads 23p' and 23n' using conventional self-aligned silicide (SALICIDE) technology. This improves the electrical characteristic of the MOS transistor since the resistance of the source/drain region decreases.

Subsequently, bit lines (not shown) and cell capacitors (not shown) can be formed in the cell array region a using a conventional technology. Those skilled in the art are capable of forming bit lines and cell capacitors, using the guidelines provided herein. A second interlayer insulating layer 27, e.g., a CVD oxide layer can be formed over the entire surface of the resultant structure having the bit lines and the cell capacitors, and over the entire surface of the peripheral circuit region b.

Figure 5:
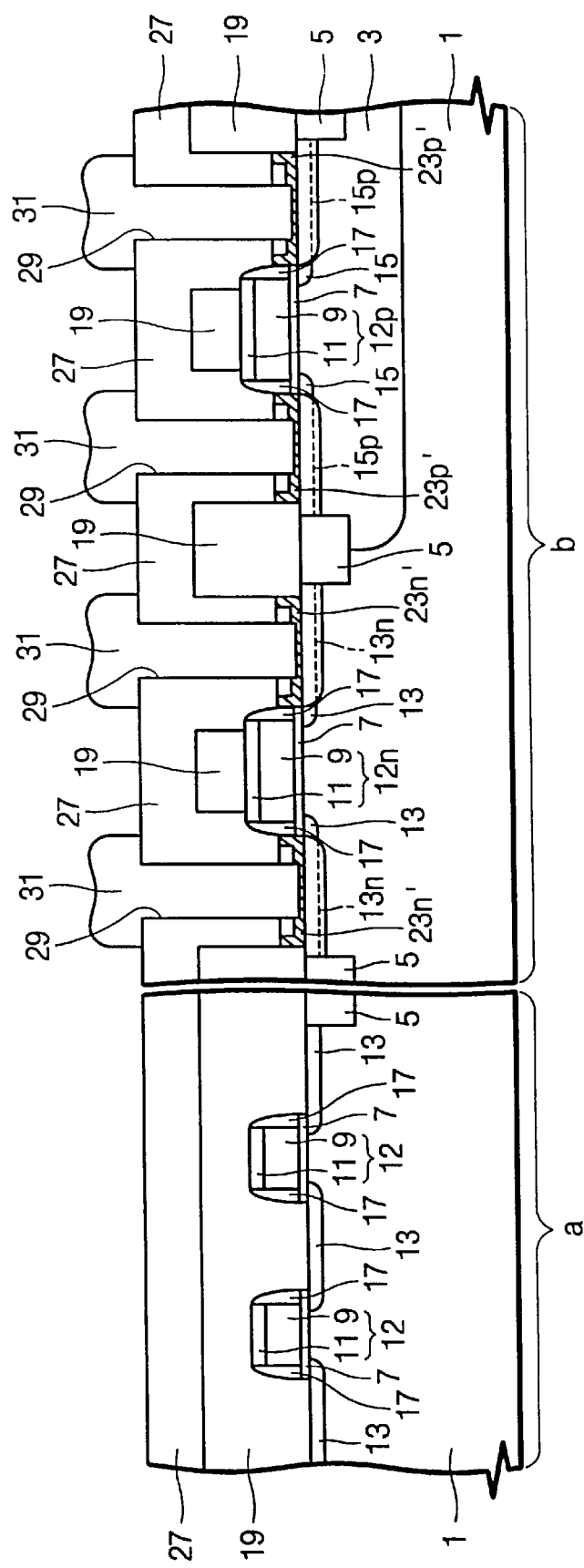

Referring now to FIG. 5, the second interlayer insulating layer 27 preferably is patterned to form metal contact holes 29 which penetrate through sacrificial interlayer residues 25r thereby exposing the pads 23p' and 23n'. It is preferred that predetermined regions of the second interlayer insulating layer 27 and sacrificial interlayer residue 25r be over-etched in order to completely expose the pads 23p' and 23n'. Because the pads 23p' and 23n' act as buffer layers, they can prevent exposure of the source/drain regions 15p and 13n by the over-etching process. Even if the source/drain regions 15p and 13n are somehow exposed during formation of the metal contact holes 29, however, the recession of the source/drain regions 15p and 13n is remarkably suppressed.

The substrate having the metal contact holes 29 then can be covered with a metal layer such as an aluminum layer or aluminum alloy layer. The metal layer then can be patterned to form metal interconnections 31 covering the metal contact holes 29 to thereby form an electrical connection with pads 23p' and 23n'.

Figure 7:
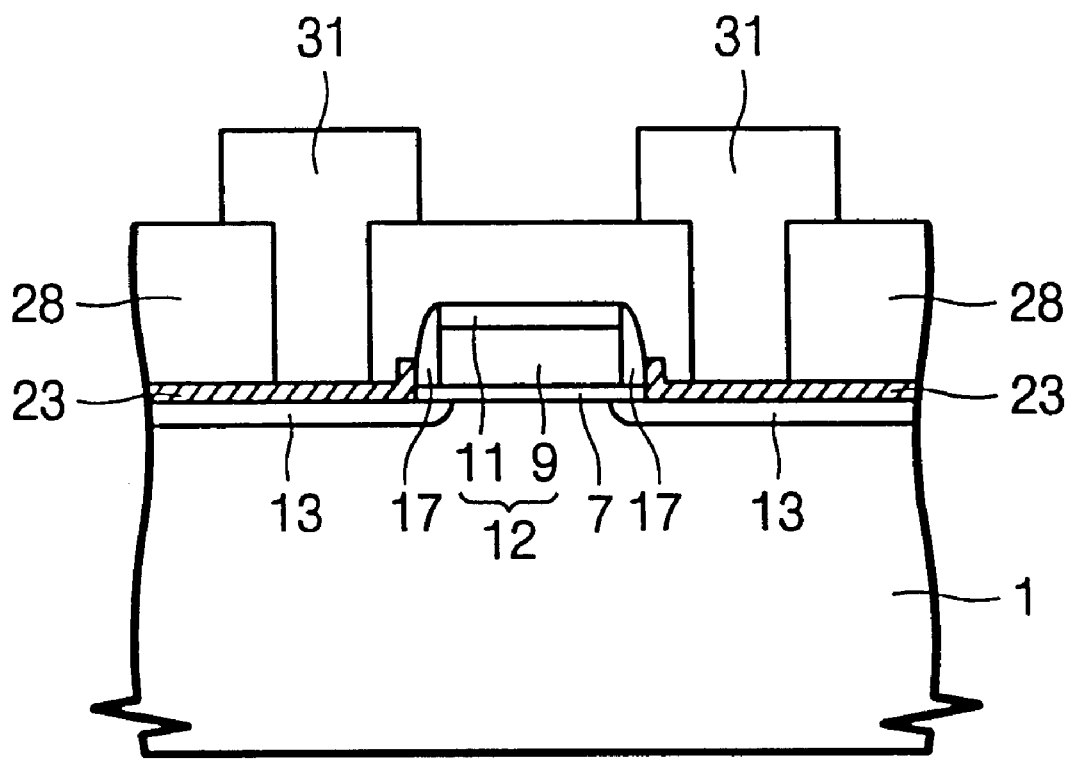
FIG. 7 is a cross-sectional view illustrating a MOS transistor according to an embodiment of the present invention.

FIG. 7 is a cross-sectional view illustrating a structure of a MOS transistor fabricated according to the method described above with reference to FIGS. 1–5. Referring to FIG. 7, an insulated gate pattern 12 is formed on a predetermined region of a semiconductor substrate 1 of first conductivity type according to the procedures described above. A gate insulating layer 7 is interposed between the substrate 1 and the insulated gate pattern 12. As described above, the insulated gate pattern 12 preferably comprises a gate electrode 9 and a capping layer 11, which are sequentially stacked. The gate electrode 9 can be made of a conductive layer, and the capping layer 11 can comprise an insulating layer such as a silicon nitride layer. Two impurity regions 13 doped with second conductivity impurities are disposed on the substrate 1 at both sides of the insulated gate pattern 12. Also, a spacer 17, preferably formed of an insulating material, is located on a sidewall of the insulated gate pattern 12.

The respective impurity regions 13 can be covered with a pad 23 of a second conductivity type. Pad 23 can be formed by first depositing a conformal undoped buffer layer, and then selectively implanting second conductivity type impurities into the conformal undoped buffer layer to form pad 23, as described above. In this embodiment, pad 23 preferably is thinner than that of the gate electrode 9. Thus, the pad 23 covers only the lower portion of the spacer 17. The insulated gate pattern 12, the spacer 17, and the pads 23 then can be covered with an interlayer insulating layer 28. The interlayer insulating layer 28 preferably comprises at least one insulating layer. For example, the interlayer insulating layer 28 may comprise a first interlayer insulating layer and a second interlayer insulating layer, which are sequentially stacked. In addition, interlayer insulating layer 28 may comprise a first interlayer insulating layer and a second interlayer insulating layer that are not sequentially stacked as described above (see, first interlayer insulating layer 19 and second interlayer insulating layer 27 in FIG. 5). Pad 23 then can be electrically connected to a metal interconnection 31 that penetrates a predetermined region of the interlayer insulating layer 28.

Embodiments of the present invention now will be described in more detail by reference to the following non-limiting examples.

EXAMPLES

Figure 6A:
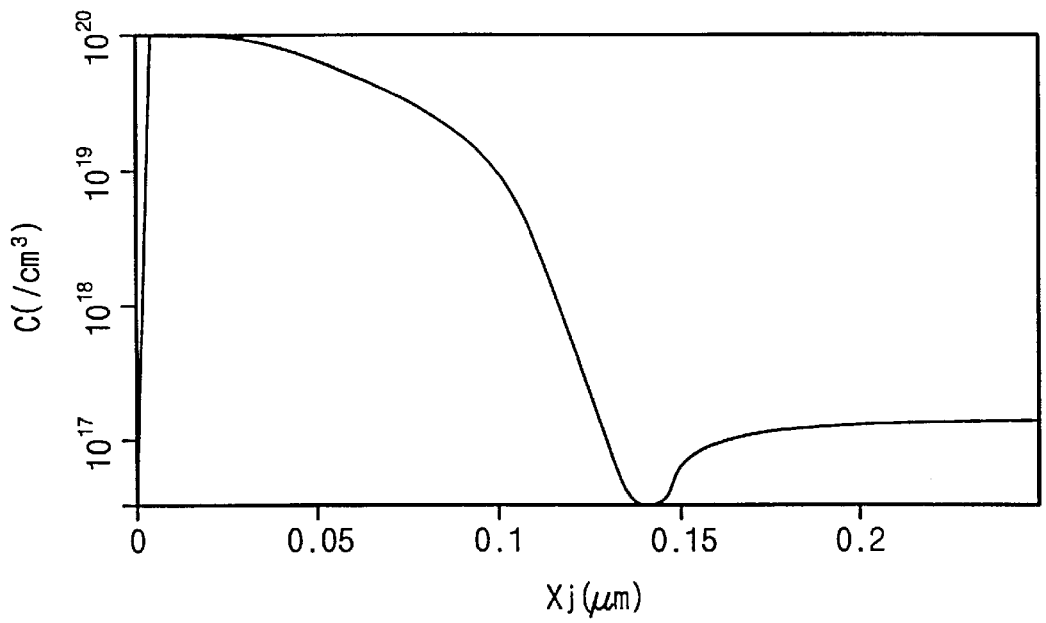
FIG. 6A is a graph illustrating a doping profile of a source/drain region of a MOS transistor prepared in the comparative example.
Figure 6B:
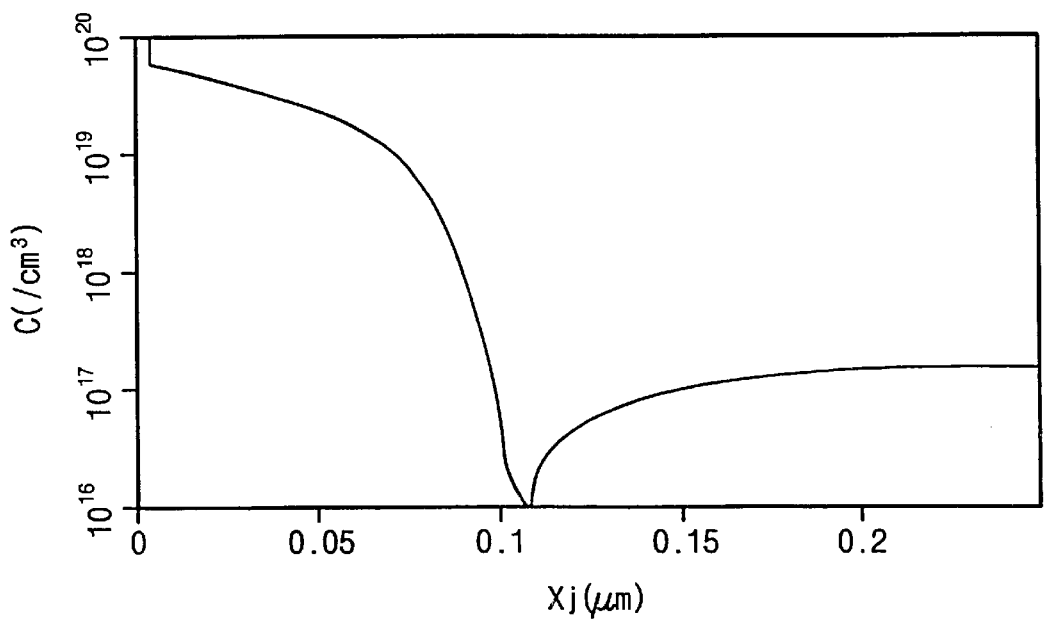
FIG. 6B is a graph illustrating a doping profile of a source/drain region of a MOS transistor prepared in the inventive example.

FIG. 6A illustrates a doping profile of a source/drain region of the a MOS transistor according to the prior art, (comparative example) and FIG. 6B illustrates a doping profile of a source/drain region of a MOS transistor according to an embodiment of the present invention (inventive example). The doping profiles shown in FIGS. 6A and 6B are simulation results. In FIGS. 6A and 6B, the x-axes indicate a depth Xj toward the bulk region of the substrate from the surface thereof, and the y-axes indicate impurity concentration C. Also, the data shown in FIGS. 6A and 6B correspond to the doping profiles of the N-type source/drain regions.

In the comparative example according to the prior art, the impurity region, e.g., the N-type LDD region was formed by ion implanting arsenic (As) ions into a P-type silicon substrate and performing an annealing process at 850° C. for 45 minutes. The arsenic ions for forming the LDD region were implanted at a dose of $1 \times 10^{13}$ ion atoms/cm$^2$ and at an energy of 20 KeV. Also, a source/drain region having a high concentration was formed by ion implanting arsenic ions into the LDD region and performing an annealing process at 800° C. for 20 minutes. The arsenic ions for forming the source/drain region having the high concentration were implanted at a dose of $2 \times 10^{15}$ ion atoms/cm$^2$ and at an energy of 30 KeV.

The inventive example according to an embodiment of the present invention utilized an undoped polysilicon layer having a thickness of 300A on the N-type LDD region which was formed in the same manner as the prior art. Arsenic ions then were implanted into the undoped polysilicon layer, and an annealing process was carried out at 800° C. for 20 minutes to form a source/drain region having a high concentration. The arsenic ions for doping the undoped polysilicon layer were implanted at a dose of $3 \times 10^{15}$ ion atoms/cm$^2$ and at an energy of 40 KeV.

Referring now to FIGS. 6A and 6B, the prior art reveals a junction depth of about 0.14 $\mu$m, whereas the present invention shows a junction depth of about 0.105 $\mu$m, which is much shallower than that of the prior art. In addition, the peak impurity concentration of the source/drain region according to the present invention is somewhat lower than the peak impurity concentration of the source/drain region according to the prior art. However, the present invention includes the doped polysilicon layer on the source/drain region. Thus, the effective resistance of the source/drain region according to the present invention may be lower than that of the source/drain region of the prior art.

In the drawings and specification, there have been disclosed typical preferred embodiments of the invention and, although specific terms are employed, they are used in a generic and descriptive sense only and not for purposes of limitation. While the present invention has been described in detail with reference to particularly preferred embodiments and examples, those skilled in the art will recognize that various modifications may be made to the invention without departing significantly from the spirit and scope thereof.

What is claimed is:

1. A method of forming a MOS transistor comprising:

providing a semiconductor substrate of a first conductivity type;

forming an insulated gate pattern having sidewalls on a predetermined region of the semiconductor substrate of the first conductivity type so that portions of the semiconductor substrate of the first conductivity type on at least one side of the insulated gate pattern remain uncovered by the gate pattern;

forming impurity regions of a second conductivity type on the semiconductor substrate of the first conductivity type at the at least one side of the insulated gate pattern;

forming a first interlayer insulating layer on the entire surface of the resultant structure having the impurity regions;

forming pad contact holes by patterning the first interlayer insulating layer and by exposing at least a portion of the impurity regions;

forming a conformal buffer layer on the entire surface of the resultant structure having the pad contact holes; and forming at least one pad by patterning the conformal buffer layer, whereby the at least one pad covers at least the impurity regions.

2. The method of claim 1, wherein the first conductivity type is a P-type, and the second conductivity type is an N-type.

3. The method of claim 1, wherein the first conductivity type is an N-type, and the second conductivity type is a P-type respectively.

4. The method of claim 1, wherein forming the insulated gate pattern further comprises:

forming a gate insulating layer on the semiconductor substrate of the first conductivity type;

sequentially forming a conductive layer and a capping layer on at least one predetermined region of the gate insulating layer; and sequentially patterning the capping layer and the conductive layer to form a gate electrode and a capping layer pattern that are sequentially stacked on a predetermined region of the gate insulating layer.

5. The method of claim 1, further comprising forming a spacer on at least one sidewall of the insulated gate pattern prior to forming the first insulating layer.

6. The method of claim 5, wherein the pad contact hole is formed using a self-aligned contact hole formation technology to thereby expose at least a portion of the spacer.

7. The method of claim 1, wherein forming the conformal buffer layer comprises:

forming a conformal undoped semiconductor layer following the step difference of the pad contact holes on the entire surface of the resultant structure having the pad contact holes; and ion-implanting second conductivity type impurities in the conformal undoped semiconductor layer to dope the conformal undoped semiconductor layer at least at the impurity regions.

8. The method of claim 7, wherein the conformal undoped semiconductor layer comprises an undoped polysilicon layer.

9. The method of claim 1, wherein forming the at least one pad comprises:

forming a sacrificial insulating layer filling the pad contact holes on the entire surface of the resultant structure having the conformal buffer layer;

etching the sacrificial insulating layer to form sacrificial insulating layer residues covering the conformal buffer layer on the bottom of the respective pad contact holes, and concurrently exposing the conformal buffer layer on an upper surface of the first interlayer insulating layer and on at least a portion of a sidewall of the respective pad contact holes; and etching the exposed conformal buffer layer using the sacrificial insulating layer residues as etching masks, to leave a portion of the conformal buffer layer under the respective sacrificial insulating layer residues.

10. The method of claim 9, wherein the exposed conformal buffer layer is etched by a wet etching process.

11. The method of claim 9, wherein the sacrificial insulating layer residues are formed by partially wet etching the sacrificial insulating layer.

12. The method of claim 1, further comprising after forming the at least one pad:

forming a second interlayer insulating layer on the entire surface of the resultant structure having the at least one pad;

patterning the second interlayer insulating layer to form a metal contact hole exposing the at least one pad; and forming a metal interconnection covering the metal contact hole.

13. A method of forming a MOS transistor, comprising:

providing a semiconductor substrate of a first conductivity type;

forming a second conductivity type well at a predetermined region of the semiconductor substrate of the first conductivity type;

forming a first insulated gate pattern having sidewalls and a second insulated gate pattern having sidewalls on a predetermined region of the semiconductor substrate of the first conductivity type, and on a predetermined region of the well, respectively so that portions of the semiconductor substrate of the first conductivity type on both sides of the first insulated gate pattern remain exposed, and portions of the well on both sides of the second insulated gate pattern remain exposed;

forming second conductivity type impurity regions on portions of the semiconductor substrate of the first conductivity type at both sides of the first insulated gate pattern that remain exposed;

forming first conductivity type impurity regions on portions of the well at both sides of the second insulated gate pattern that remain exposed;

forming a first interlayer insulating layer on the entire surface of the resultant structure having the first and second conductivity type impurity regions and the first and second insulated gate patterns;

patterning the first interlayer insulating layer to form pad contact holes, thereby exposing the first and second conductivity type impurity regions so that portions of the first interlayer insulating layer remain disposed on the first and second insulated gate patterns;

forming a conformal undoped buffer layer on the entire surface of the resultant structure having the pad contact holes and the portions of the first interlayer insulating layer;

ion-implanting second conductivity type impurities in the conformal undoped buffer layer that is disposed on the second conductivity type impurity regions to form a second conductivity type buffer layer;

ion-implanting first conductivity type impurities in the conformal undoped buffer layer that is disposed on the first conductivity type impurity regions to form a first conductivity type buffer layer;

forming sacrificial insulating layer residues covering the first and second conductivity type buffer layers on bottoms of the pad contact holes; and etching the first and second conductivity type buffer layer using the sacrificial insulating layer residues as etching masks to form a first conductivity type pad and a second conductivity type pad on the first conductivity type impurity region and on the second conductivity type impurity region, respectively.

14. The method of claim 13, further comprising forming spacers on the sidewalls of the first and second insulated gate patterns prior to forming the first interlayer insulating layer.

15. The method of claim 13, wherein forming the sacrificial insulating layer residues comprises:

forming a sacrificial insulating layer filling the pad contact holes on the entire surface of the resultant structure having the first and second conductivity type buffer layers; and etching the sacrificial layer to expose the buffer layers on the upper surface of the first interlayer insulating layer and on sidewalls of the pad contact holes.

* * * * *